(12) United States Patent
Piquette et al.

(10) Patent No.: US 11,349,051 B2
(45) Date of Patent: May 31, 2022

(54) OPTOELECTRONIC DEVICE AND METHOD OF PRODUCING AN OPTOELECTRONIC DEVICE

(71) Applicant: OSRAM Opto Semiconductors GmbH, Regensburg (DE)

(72) Inventors: Alan Piquette, Kensington, NH (US); Maxim N. Tchoul, Winchester, MA (US); Mary Ann Johnson, Rockport, MA (US); Gertrud Kräuter, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 30 days.

(21) Appl. No.: 16/409,500

(22) Filed: May 10, 2019

(65) Prior Publication Data

US 2020/0357964 A1 Nov. 12, 2020

(51) Int. Cl.
*H01L 33/56* (2010.01)
*C09D 183/04* (2006.01)
*H01L 33/48* (2010.01)
*H01L 33/50* (2010.01)
*H01L 33/60* (2010.01)
(Continued)

(52) U.S. Cl.
CPC ............ *H01L 33/56* (2013.01); *C09D 183/04* (2013.01); *H01L 33/486* (2013.01); *H01L 33/50* (2013.01); *H01L 33/60* (2013.01); *H01L 33/62* (2013.01); *H01L 33/641* (2013.01); *H01L 2933/005* (2013.01); *H01L 2933/0058* (2013.01); *H01L 2933/0066* (2013.01); *H01L 2933/0075* (2013.01)

(58) Field of Classification Search
CPC ........ H01L 33/56; H01L 33/486; H01L 33/62
See application file for complete search history.

(56) References Cited

U.S. PATENT DOCUMENTS 10,840,413 B2    11/2020  Reeswinkel et al.
2015/0188007 A1*  7/2015  Mochizuki ............... C08K 3/20
                                                      257/98
2015/0299465 A1  10/2015  Toyota et al.
(Continued)

FOREIGN PATENT DOCUMENTS

DE   102016115921 A1   3/2018
EP       2065931 A1    6/2009
(Continued)

OTHER PUBLICATIONS

NIH PubChem Compound information for dimethyldimethoxysilane (2021) (retrieved from https://pubchem.ncbi.nlm.nih.gov/) (Year: 2021).*

(Continued)

*Primary Examiner* — Michele Fan
(74) *Attorney, Agent, or Firm* — Slater Matsil, LLP

(57) ABSTRACT

An optoelectronic device and a method of producing an optoelectronic device are disclosed. In an embodiment an optoelectronic device includes components including an active layer stack, a housing and electrical contacts and at least one protective layer on a surface of at least one of the components, wherein the at least one protective layer includes a cross-linked material with a three-dimensional polysiloxane-based network.

9 Claims, 3 Drawing Sheets

(51) Int. Cl.
  *H01L 33/62*  (2010.01)
  *H01L 33/64*  (2010.01)

(56) References Cited

U.S. PATENT DOCUMENTS

| | | |
|---|---|---|
| 2018/0332686 A1* | 11/2018 | Hotta .................. C08K 3/34 |
| 2018/0340119 A1 | 11/2018 | Piquette et al. |
| 2019/0123248 A1 | 4/2019 | Kräuter et al. |
| 2019/0259919 A1 | 8/2019 | Piquette et al. |
| 2019/0322837 A1 | 10/2019 | Tchoul et al. |
| 2019/0352561 A1 | 11/2019 | Piquette et al. |
| 2021/0189096 A1* | 6/2021 | Dos Santos Freire .... C09C 3/12 |

FOREIGN PATENT DOCUMENTS

| | | |
|---|---|---|
| WO | 2017182390 A1 | 10/2017 |
| WO | 2018002334 A1 | 1/2018 |
| WO | 2018215204 A1 | 11/2018 |

OTHER PUBLICATIONS

Viscosity Converting Chart from The Engineering Toolbox (2021) (retrieved from 2021) (retrivied from https://www.engineeringtoolbox.com/viscosity-converter-d_413.html) (Year: 2021).*

* cited by examiner

OPTOELECTRONIC DEVICE AND METHOD OF PRODUCING AN OPTOELECTRONIC DEVICE

TECHNICAL FIELD

The invention relates to an optoelectronic device. It further relates to a method of producing an optoelectronic device.

SUMMARY

Embodiments provide an optoelectronic device with at least one protective layer. Further embodiments provide a method of producing an optoelectronic device with at least one protective layer.

According to one embodiment, an optoelectronic device is provided. The optoelectronic device is configured to emit electromagnetic radiation during operation of the device. For example, the optoelectronic device is a light-emitting diode (LED) or a laser diode.

According to one embodiment, the optoelectronic device comprises components including an active layer stack, a housing and electrical contacts.

The active layer stack is configured to emit electromagnetic radiation during operation of the optoelectronic device. The active layer stack may have an active area that is configured to generate electromagnetic radiation during operation of the optoelectronic device. The electromagnetic radiation generated in the active area is emitted from a radiation emission surface of the active layer stack forming a radiation beam. The electromagnetic radiation emitted from the active layer stack is called a primary radiation. In particular, the primary radiation forms the radiation beam.

The active layer stack can be arranged in a housing. In particular, the housing can have a recess, in which the active layer stack can be arranged. A housing provides stabilization and protection for the components of an optoelectronic device. In addition, at least one surface of the housing may be a reflective surface. In particular, surfaces of the housing inside the recess may be reflective surfaces or may be coated with a reflective layer.

Here and in the following, "reflective surface" means a surface of a component which is reflective itself as well as a surface of a component which is provided with a reflective layer.

Reflective surfaces have good reflective properties over the desired spectral range. Reflective surfaces can increase the brightness and/or the efficiency of the optoelectronic device since scattered light can be reflected by the reflective surfaces. In particular, reflective surfaces can be metallic or coated with a metal. The reflective surfaces can have a reflectivity $\geq 90\%$, in particular $\geq 95\%$, preferably $\geq 99\%$.

Electrical contacts are used for contacting the active layer stack of the optoelectronic device. In particular, electrical contacts can be metallic. Electrical contacts can comprise, for example, conductive layers, lead frames, contact pads, bonding wires, pins, balls, and/or electrodes.

The optoelectronic device can comprise only the above-mentioned components. Alternatively or additionally, the optoelectronic device can comprise further components. These further components can comprise but are not limited to any of the above-mentioned components. In particular, the optoelectronic device can further comprise a conversion element and/or an encapsulation and/or independent reflective layers and/or surfaces that are not part of the housing.

A conversion element can, in particular, be arranged in the radiation beam of the active layer stack. The conversion element can comprise phosphor particles and a matrix material. In particular, the conversion element can comprise or consist of phosphor particles. The conversion element, in particular the phosphor particles, is configured to convert the wavelength of primary radiation emitted from the active layer stack into a secondary radiation. "Wavelength conversion" means here and in the following that primary radiation of a first wavelength range is converted, at least partially, in secondary radiation of a second wavelength range which preferably comprises longer wavelength than the primary radiation.

To stabilize the components in the optoelectronic device, the components can be encapsulated in an encapsulation material. In particular, the encapsulation can fill the recess of the housing. Encapsulation materials can comprise, for example, epoxy resin or silicone.

In particular, the optoelectronic device comprises a housing with a recess, in which an active layer stack is arranged. The active layer stack is contacted with electrical contacts. A conversion element can optionally be arranged above the active layer stack in such a way that the radiation emitted from the active layer stack passes through at least a part of the conversion element. Preferably, the conversion element can be arranged inside the recess of the housing. The recess of the housing can optionally be filled with an encapsulation at least partially, preferably completely, surrounding the components arranged in the recess of the housing. At least one surface of the housing, in particular at least one surface of the recess of the housing, can be a reflective surface.

Here and in the following, surfaces of the components are to be understood as any outer surface of the components which not necessarily have to be an outer surface of the device, but can be inside the device in dependence of the location of the respective component in the device. Furthermore, the surfaces of the components also comprise partial areas of the surface and not necessarily the complete surface of the respective component.

According to one embodiment, a surface of at least one of the components is sensitive to external influences. External influences can be, for example, ambient conditions such as harmful or corrosive gases, for example, water vapor or hydrogen sulfide. A sensitive surface is susceptible to degradation or corrosion. For example, sensitive surfaces can react with corrosive gases to form a chemical compound that has a different physical and/or chemical property than the surface itself. The degradation or corrosion is not necessarily restricted to the surface of a component. In particular, the entire component can be affected. Sensitive surfaces can be, for example, reflective surfaces and/or surfaces of phosphor containing conversion elements, conductive layers, reflective layers and/or electrical contacts.

According to at least one embodiment, the optoelectronic device comprises at least one protective layer on a surface of at least one of the components. "On a surface" means here and in the following that the protective layer is in direct mechanical contact to a surface of at least one of the components. The protective layer does not necessarily have to be arranged on the entire surface of the component, but can only be arranged on partial areas of the surface of the component. For example, the protective layer can only be arranged on the surface of the housing facing towards the active layer stack. In particular, the protective layer follows the form of the surface on which the protective layer is arranged. Although the protective layer is in direct mechanical contact to a surface of at least one of the components, it does not necessarily have to be in direct mechanical contact to a sensitive surface. In particular, the protective layer and the sensitive surface can be spaced apart.

A protective layer is configured or designed to protect surfaces sensitive or susceptible to corrosion or degradation from the environment, for example, harmful gases such as water vapor or hydrogen sulfide. For this purpose, the at least one protective layer does not necessarily need to be arranged in direct mechanical contact to the sensitive surface as long as the protective layer is arranged somewhere between the sensitive surface and the environment. Thus, other layers and/or components can be arranged between the sensitive surface and the protective layer. The other layers and/or components can be further components of the optoelectronic device such as conversion elements or independent reflective layers and/or surfaces. These further components can additionally be coated and thus protected with a protective layer.

For the use in an optoelectronic device, the protective layer can be, in particular, a transparent layer or film.

According to at least one embodiment, the at least one protective layer comprises a cross-linked material with a three-dimensional polysiloxane-based network. The backbone of a polysiloxane-based network comprises alternating silicon and oxygen atoms. In particular, the polysiloxane-based network only comprises silicon-oxygen bonds and no carbon-carbon bonds as part of its backbone. As a result, the network is mainly based on T-unit bonding in contrast to the D-unit bonding of typical silicones. Here, T-unit and D-unit refer to the relative number of oxygen and carbon atoms bonded to each silicon atom in the polysiloxane. In a T-unit of a polysiloxane, the silicon atom is bonded to three oxygen and one carbon atom, wherein in a D-unit, the silicon is bonded to two oxygen and two carbon atoms. With a backbone comprising mainly T-units, a dense three-dimensional network can be formed without the introduction of carbon-carbon bonds for cross-linking.

According to one embodiment, the optoelectronic device comprises components including an active layer stack, a housing and electrical contacts, and at least one protective layer on a surface of at least one of the components, wherein the at least one protective layer comprises a cross-linked material with a three-dimensional polysiloxane-based network.

In an optoelectronic device with a protective layer on the surface of at least one of the components, sensitive surfaces are better protected against degradation or corrosion since, compared to traditional optical silicones, the protective layer is much more impermeable towards chemical species that are present in the environment. In addition, the protective layer is thermally stable due to the T-unit bonding and therefore does not degrade from the temperature and/or light flux from the device as it is the case with, for example, epoxy resin.

According to one embodiment, the at least one protective layer is free of a converter material. Free of a converter material means here and in the following that no phosphor particles or phosphor molecules are present in the at least one protective layer. It does not mean, however, that the at least one protective layer is free of any particle.

According to one embodiment, additives, for example, nanoparticles, can be present in the at least one protective layer in order to change a property of the protective layer such as the refractive index or the thermal conductivity. Additives can be, for example, oxides, nitrides, carbon-based compounds, heteropolyacids, metal-organic compounds, organic molecules, and/or polymers. In particular, these additives do not comprise or consist of a converter material or phosphor particles.

According to one embodiment, the cross-linked material with a three-dimensional polysiloxane-based network of the at least one protective layer is made from a liquid precursor material comprising the structure:

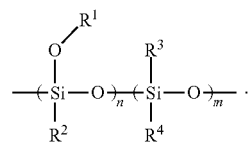

wherein $R^1$ is an alkyl group, $R^2$, $R^3$ and $R^4$ are, independently of one another, an alkyl or an aryl group and $n+m=1$. The formula is not meant to suggest that all repeat units of the T-unit groups are on one side of the polysiloxane and all repeat units of the D-unit groups are on the other, as it is the case for a block copolymer. While this is a possibility, the formula is simply meant to show that there are some T-unit groups present somewhere in the structure and possibly some D-unit groups present somewhere in the structure and the ratio of the two types of groups is determined by the values of the indices n and m. The indices n and m represent the relative number fractions of the corresponding monomeric groups in the siloxane precursor formula. The more T-units are present in the polysiloxane material, the higher the degree of cross-linking becomes. A polysiloxane with high amount of T-units tends to be more brittle than a polysiloxane with additional D-units in its structure.

According to one embodiment, $0.50 \leq n \leq 1$ and $0 \leq m \leq 0.50$, in particular $0.75 \leq n \leq 1$ and $0 \leq m \leq 0.25$. For example, n can equal 1 and m thus equals 0.

Here and in the following, "liquid precursor material" is to be understood that the precursor material is a liquid at room temperature.

$R^1$, $R^2$, $R^3$ and $R^4$ are side groups. $R^1$ is an alkyl group, for example, a methyl group or an ethyl group. $R^2$, $R^3$ and $R^4$ are, independently of one another, an alkyl or an aryl group, for example, methyl or phenyl groups. According to one embodiment, all R-groups can be the same groups, for example, methyl groups. In other embodiments, each functional group can be a different group. In another embodiment, some of the groups can be identical and some can be different. In some embodiments, one or several or all of the groups can be made up of more than one functional group, for example, methyl and phenyl groups.

According to one embodiment, the number of repeat units and/or the selection of the R-groups can determine the viscosity and/or the molecular weight of the liquid precursor material. The viscosity of the liquid precursor material can be between 1 mPa·s and 150 mPa·s inclusive, preferably between 1 mPa·s and 60 mPa·s inclusive and particularly preferably between 1 mPa·s and 20 mPa·s inclusive. The number of repeat units should be chosen so that the molecular weight of the liquid precursor material is less than 900 g/mol, preferably less than 500 g/mol and, in some embodiments, less than 250 g/mol. It should be noted that, in some embodiments, the liquid precursor material can be a mixture of similar materials with the same repeat units but with different degrees of polymerization and therefore different molecular weights.

According to one embodiment, the liquid precursor material comprises a methoxy siloxane. In a methoxy siloxane, the side group $R^1$ is a methyl group. For this precursor material, the methoxy content can be between 10 weight-% (wt %) and 50 wt % inclusive, in particular between 15 wt % and 45 wt % inclusive, preferably between 30 wt % and 40 wt % inclusive and particularly preferably 35 wt %.

According to one embodiment, the liquid precursor material comprises a methoxy methyl siloxane. A methoxy methyl siloxane has the following structure:

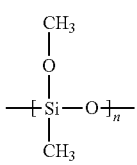

with n=1 and m=0. Both side groups R¹ and R² are methyl groups. A methoxy methyl precursor can have a methoxy content in the order of 35 wt %. Again, it should be noted that the indices n and m represent the relative number fractions of the corresponding monomeric groups in the siloxane precursor formula and not the chain length of the siloxane precursor. A methoxy methyl siloxane precursor results in a cross-linked methyl polysiloxane material.

According to one embodiment, the liquid precursor material can also be partially reacted as in the following exemplary structure:

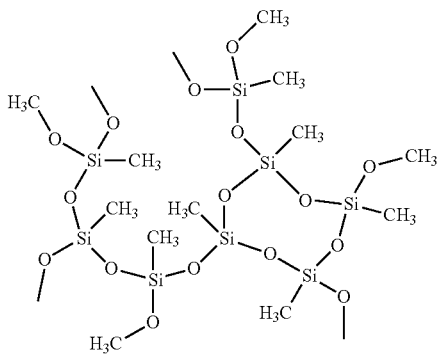

The dangling bonds can each indicate a continuation of the structure or a terminal group. In a partially reacted precursor, the methoxy content will be lower than for the unreacted precursor and thus, its viscosity tends to be higher.

An exemplary, idealized structure of a polysiloxane network which results if all of the methoxy groups in a methoxy methyl siloxane precursor participate in the cross-linking is shown in the following structure:

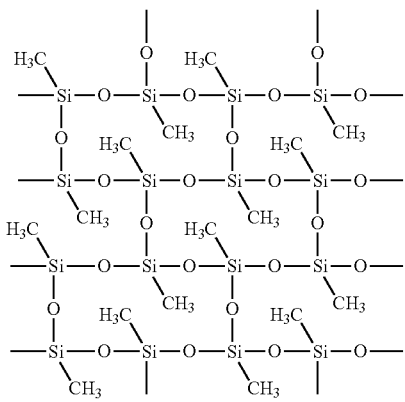

Again, the dangling bonds can each indicate a continuation of the structure or a terminal group. It should be noted that the structure is an example that is not necessarily meant to be technically accurate. In reality, not all of the methoxy groups would necessarily result in cross-linking. Some of the methoxy groups might remain intact and some of the methoxy groups might be replaced by silanol groups.

According to one embodiment the liquid precursor material comprises a methoxy methyl phenyl siloxane. In a methoxy methyl phenyl siloxane, n can equal 1 and m can equal 0. The side group R¹ is a methyl group and the side group R² comprises methyl and phenyl groups. A methoxy methyl phenyl siloxane precursor results in a cross-linked methyl phenyl polysiloxane material. Due to the phenyl groups, a methyl phenyl polysiloxane material is less dense and thus less brittle. In addition, it increases the refractive index of the protective layer which is advantageous for light extraction.

According to one embodiment, the cross-linked polysiloxane-based material of the protective layer contains less than 40 weight percent (wt %) organic content, in particular less than 30 wt % and preferably less than 20 wt %. The organic content of the cross-linked polysiloxane-based material with mainly T-unit bonding is smaller compared to optical silicones with D-unit bonding, which can have an organic content of almost 60 wt %. As a result, the cross-linked polysiloxane-based material has a higher thermal stability and a lower permeability than silicone. Organic content can be, for example, methyl and/or phenyl groups.

According to one embodiment, the at least one protective layer is arranged on a surface of the housing and/or of the electrical contacts and is in direct mechanical contact to the surface of the housing and/or of the electrical contacts. In direct mechanical contact means, that the at least one protective layer directly coats the surface of the housing and/or the electricals contacts. In other words, the protective layer and the surface of the housing and/or the electricals contacts have a common boundary surface. In particular, the protective layer is arranged on the surface of a recess of the housing and/or on a surface of the electrical contacts and is in direct mechanical contact to the surface of the recess of the housing and/or the surface of the electrical contacts.

According to one embodiment, the surface of the housing and/or of the electrical contacts comprises silver. In particular, the surface of the recess of the housing and/or the electrical contacts consists of silver. Silver can have a good electrical and thermal connection to the active layer stack. In addition, silver has a very high reflectivity over the visible spectral range and thus increases the brightness and/or the efficiency of the optoelectronic device. Silver is especially susceptible to corrosion due to chemical species that are often present in the environment such as sulfides. Sulfides, such as hydrogen sulfide gas, react with silver to form silver sulfide, which is a gray/black material that is detrimental to both the reflectivity and the conductivity of silver.

According to one embodiment, the at least one protective layer comprises traces of titanium, zirconium or tin. During processing of the protective layer, the curing of the liquid precursor material can be enhanced by adding a hardener. A hardener reacts with the liquid precursor material to form a highly cross-linked network of siloxane bonds. Hardeners are, for example, titanium, zirconium and tin metal-organic compounds, in particular, titanium alkoxides, for example, titanium tetra-n-butoxide. In particular, the protective layer comprises traces of titanium. "Traces" means that detectable quantities of titanium, zirconium or tin are present in the protective layer. However, the detectable quantities in the protective layer do not affect the properties of the material of the protective layer.

According to one embodiment, the at least one protective layer has a layer thickness of 0.5 µm to 50 µm, in particular of 0.75 µm to 20 µm and preferably of 1 µm to 10 µm. The layer thickness may depend on the location of the protective layer with respect to the sensitive surface that should be protected as well as the ratio of T-units to D-units in the polysiloxane-based network of the protective layer. If the protective layer is in direct mechanical contact to the sensitive surface and/or has a high T-unit to D-unit ratio, the layer can be very thin and still sufficiently protect the sensitive surface. If the sensitive surface is located remote from the protective layer and/or the protective layer has a low T-unit to D-unit ratio, the layer possibly has to be thicker to achieve a sufficient protection.

Another aspect of the invention relates to a method of producing an optoelectronic device. The method described here is preferably used to produce the optoelectronic device described here. Features and embodiments of the method are therefore also disclosed for the optoelectronic device and vice versa.

According to one embodiment, the method of producing an optoelectronic device comprises the step of arranging components of the device comprising an active layer stack, a housing and electrical contacts. Optionally, the device can comprise further components, for example, a conversion element and/or an encapsulation and/or independent reflective layers and/or surfaces.

Characteristics of the single components and their arrangement in the device are already disclosed with respect to the optoelectronic device and apply also for the method.

According to one embodiment the method comprises the step of applying a liquid precursor material to a surface of at least one of the components. The liquid precursor material can be applied to any surface of the components. In particular, the liquid precursor material can be applied to any clean surface. Other than providing a clean surface, no pre-treatment of the surfaces is necessary.

The precursor material is liquid at room temperature and can be applied to a surface of at least one of the components with liquid deposition techniques. Depending on the deposition technique, the viscosity of the liquid precursor material may need to be altered. To increase the viscosity, fumed silica can be added. To decrease the viscosity, organic solvents such as alkanes, for example, heptane, aromatic compounds, for example, xylene, esters, for example, butyl acetate or ketones can be added.

According to one embodiment, the liquid precursor material comprises a liquid siloxane precursor material. The liquid siloxane precursor material can comprise siloxane-based chemical compounds with a small number of repeat unit of monomeric units comprising a silicon-oxygen backbone. In other words, the liquid siloxane precursor material comprises small siloxane oligomers thus having a low molecular weight and a low viscosity. In particular, the siloxane precursor material comprises alkoxy groups for cross-linking.

According to one embodiment, the method comprises the step of curing the liquid precursor material to form a cross-linked material with a three-dimensional polysiloxane-based network. During the curing process, the chemical compounds of the liquid precursor material react with each other and form a highly cross-linked material. The highly cross-linked material comprises a three-dimensional polysiloxane-based network with mainly T-unit bonding. Thus, the three-dimensional network comprises silicon-oxygen bonds and can be formed without the introduction of carbon-carbon bonds in the backbone for cross-linking. The cured cross-linked material forms a transparent layer or film on the surface of the at least one component the liquid precursor material was applied on. This layer or film is hereinafter referred to as a protective layer. In particular, the protective layer is thermally stable and more impermeable towards chemical species compared to optical silicones.

According to one embodiment, the method steps of applying and curing the liquid precursor material take place during or after arranging the components of the device. In other words, the method steps of applying and curing the liquid precursor material can take place any time during the production of the optoelectronic device, and, thus, a protective layer can be formed at any desired location in the optoelectronic device. Once the curing is complete, the remainder of the optoelectronic device fabrication steps can be carried out. Thus, the protective layer can be applied directly on predetermined surfaces during the typical device fabrication process, or it can be applied later on in the fabrication creating a protective barrier in a remote location from most surfaces of the components of the device.

According to one embodiment, the method of producing an optoelectronic device comprises the steps: arranging components of the device comprising an active layer stack, a housing and electrical contacts, applying a liquid precursor material to a surface of at least one of the components, wherein the liquid precursor material comprises a liquid siloxane precursor material, and curing the liquid precursor material to form a cross-linked material with a three-dimensional polysiloxane-based network, wherein applying and curing the liquid precursor material takes place during or after arranging the components of the device.

The method steps for producing an optoelectronic device described here are not restricted to this order. According to a preferred embodiment, however, they are carried out in this order.

The method produces a protective layer in an optoelectronic device with a higher thermal stability than epoxy resin and a higher impermeability towards chemical species than optical silicones. In addition, the protective layer can be produced with an easier and less expensive method than the commonly used inorganic layers made of, for example, $SiO_2$ by more complex and expensive physical or chemical vapor deposition processes.

According to one embodiment, the liquid precursor material is applied to all exposed surfaces or to selectively predetermined surfaces. Thus, the liquid precursor material can be applied to more than one surface at the same time. In particular, the liquid precursor material can be applied to surfaces of more than one component of the optoelectronic device. "All exposed surfaces" mean all surfaces of the components that are in contact with the environment at the time when the liquid precursor material is applied. The protective layer is then formed on the entire surface facing towards the environment covering all exposed surfaces of the components. This procedure is simple and cost-efficient and is especially advantageous if many or all exposed surfaces are sensitive or susceptible to corrosion or degradation and therefore need to be protected.

"Selectively predetermined surfaces" means specific surfaces chosen to be coated with the protective layer beforehand. Thus, the protective layer is formed only on these predetermined surfaces. In particular, all exposed non-predetermined surfaces of the components remain free of the protective layer. Selectively predetermined surfaces can be surfaces of components that need to be protected from chemical species like, for example, reflective surfaces.

According to one embodiment, at least one surface of the components comprises silver or the predetermined surface comprises silver. Thus, the at least one surface comprising silver may be a reflective surface or an electrical contact.

Silver surfaces can be, for example, surfaces of the housing, in particular surfaces of the recess of the housing, and/or of electrical contacts due to the good reflectivity and thermal and electrical conductivity of silver. Thus, the surfaces of the housing and/or of electrical contacts can be predetermined surfaces. Silver surfaces are susceptible to corrosion due to chemical species, for example, hydrogen sulfide and are therefore especially suited for protection with protective layers.

According to one embodiment, the liquid precursor material is applied using spray coating, spin coating, dip coating, dispensing, jetting, tape casting or doctor blading.

According to one embodiment, the liquid precursor material is a liquid siloxane precursor material comprising the structure:

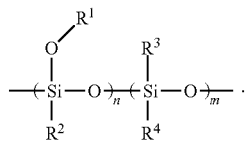

wherein $R^1$ is an alkyl group and $R^2$, $R^3$ and $R^4$ are, independently of one another, an alkyl or an aryl group and n+m=1. The indices n and m represent the relative number fractions of the corresponding monomeric groups in the siloxane precursor formula.

According to one embodiment, $0.50 \leq n \leq 1$ and $0 \leq m \leq 0.50$, in particular $0.75 \leq n \leq 1$ and $0 \leq m \leq 0.25$. For example, n can equal 1 and m thus equals 0.

$R^1$, $R^2$, $R^3$ and $R^4$ are side groups. $R^1$ is an alkyl group, for example, a methyl group or an ethyl group. $R^2$, $R^3$ and $R^4$ are, independently of one another, an alkyl or an aryl group, for example, methyl or phenyl groups. According to one embodiment, all R-groups can be the same groups, for example, methyl groups. In other embodiments, each functional group can be a different group. In another embodiment, some of the groups can be identical and some can be different. In some embodiments, one or several or all of the groups can be made up of more than one functional group, for example, methyl and phenyl groups.

According to one embodiment, the number of repeat units and/or the selection of the R-groups can determine the viscosity and/or the molecular weight of the liquid precursor material. The viscosity of the liquid precursor material can be between 1 mPa·s and 150 mPa·s inclusive, preferably between 1 mPa·s and 60 mPa·s and particularly preferably between 1 mPa·s and 20 mPa·s.

According to one embodiment, the molecular weight of the liquid precursor material is less than 900 g/mol, preferably less than 500 g/mol and, in some embodiments, less than 250 g/mol. It should be noted that, in some embodiments, the liquid precursor material can be a mixture of similar materials with the same repeat units but with different degrees of polymerization and therefore different molecular weights.

According to one embodiment, the liquid precursor material comprises a methoxy methyl siloxane with n=1, m=0 and $R^1=R^2$=methyl. In particular, the liquid precursor material can be a mixture of different molecular weight species of methoxy methyl siloxane. The methoxy methyl siloxane precursor can be a liquid at room temperature and is therefore suited for liquid deposition techniques.

According to one embodiment, the liquid siloxane precursor material can also be partially reacted as in the following exemplary structure:

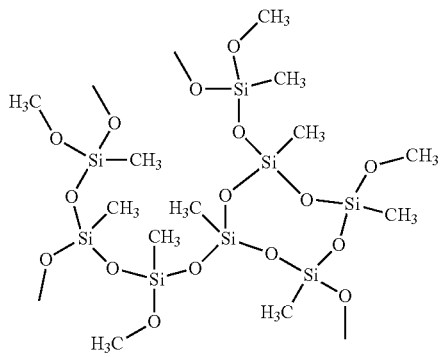

The dangling bonds can each indicate a continuation of the structure or a terminal group. In a partially reacted precursor, the methoxy content will be lower than for the unreacted precursor and thus, the viscosity tends to be higher.

According to one embodiment, the liquid precursor material comprises a methoxy methyl phenyl siloxane with n=1, m=0, $R^1$=methyl and $R^2$=methyl and phenyl. In particular, the liquid precursor material can be a mixture of different molecular weight species of methoxy methyl phenyl siloxane. The methoxy methyl phenyl siloxane precursor can be a liquid at room temperature and is therefore suited for liquid deposition techniques. Due to the phenyl groups, a methyl phenyl polysiloxane material is less dense and thus less brittle. In addition, it increases the refractive index of the protective layer which is advantageous for light extraction.

According to one embodiment, curing the liquid precursor material includes hydrolysis and condensation reactions. The hydrolysis and condensation reactions cross-link the liquid precursor material into a dense polysiloxane network with a silicon-oxygen backbone. In particular, the liquid precursor material is not cross-linked by addition reactions incorporating carbon-carbon bonds into the network. Thus, the cross-linking of the network is based on silicon-oxygen bonds and not on carbon-carbon bonds. In addition, no platinum-based catalysts have to be used for the curing of the liquid precursor material via hydrolysis and condensation reactions as it is the case for cross-linking via addition reactions of, for example, D-unit based polysiloxanes.

According to one embodiment, curing the liquid precursor material comprises exposing the liquid precursor material to humidity. In particular, exposing the liquid precursor material to the humidity in the air can be sufficient to start the curing reaction. In particular, the curing reaction can be carried out at room temperature.

According to one embodiment, curing the liquid precursor material is carried out at a temperature higher than room temperature. The curing temperature can be chosen to be slightly above an operation temperature of the optoelectronic device to avoid shrinking of the protective layer and/or a color location shift of the optoelectronic device after fabrication, for example, during operation of the optoelectronic device.

According to one embodiment, a hardener is added to the liquid precursor material before applying the liquid precursor material to the surface of at least one of the components.

A hardener reacts with the liquid precursor material to form a highly cross-linked network of siloxane bonds. In particular, the hardener reacts with the liquid precursor material in the presence of humidity. Hardeners are, for example, titanium, zirconium and tin metal-organic compounds, in particular, titanium alkoxides, for example, titanium tetra-n-butoxide. For example, 0.5 wt % to 5.0 wt % of a hardener is added to the liquid precursor material.

According to one embodiment, additives are added to the liquid precursor material before applying the liquid precursor material to the surface of at least one of the components. Additives are used to change a property of the protective layer, such as the refractive index or the thermal conductivity.

According to one embodiment, the additives are nanoparticles. The nanoparticles can be chosen from a group consisting of oxides, like silicon dioxide ($SiO_2$), zirconium dioxide ($ZrO_2$), titanium dioxide ($TiO_2$), aluminum oxide ($Al_2O_3$), or zinc oxide (ZnO), nitrides, like aluminum nitride (AlN), silicon nitride ($Si_3N_4$), boron nitride (BN), or gallium nitride (GaN), carbon-based nanoparticles, like carbon nanotubes, graphene, or their derivatives, heteropolyacides like 12-tungstophosphoric acid ($H_3PW_{12}O_{40}$) and 12-tungstosilicic acid ($H_4SiW_{12}O_{40}$), and any combinations thereof.

According to one embodiment, the surfaces of the inorganic nanoparticles can be modified with capping agents to make them miscible with the liquid precursor material.

According to one embodiment, the additives are metal-organic compounds. The metal-organic compounds are chosen from a group consisting of titanium alkoxides, zirconium alkoxides, aluminum alkoxides, silicon alkoxides, hafnium alkoxides, and any combination thereof.

According to one embodiment, the additives are organic molecules. The organic molecules are chosen from a group consisting of adhesion promoters, plasticizers, defoamers, thickeners, or thinners.

According to one embodiment, additives are organic or inorganic polymers. The organic polymers or the inorganic polymers can be chosen from a group consisting of poly(dimethyl siloxane), poly(methylphenyl siloxane), poly(diphenyl siloxane), poly(silphenylene siloxane), polyphosphazenes, polysilazane, or perhydropolysilazane.

BRIEF DESCRIPTION OF THE DRAWINGS

Advantageous embodiments and developments of the optoelectronic device and the method of producing an optoelectronic device will become apparent from the exemplary embodiments described below in association with the figures.

In the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1:
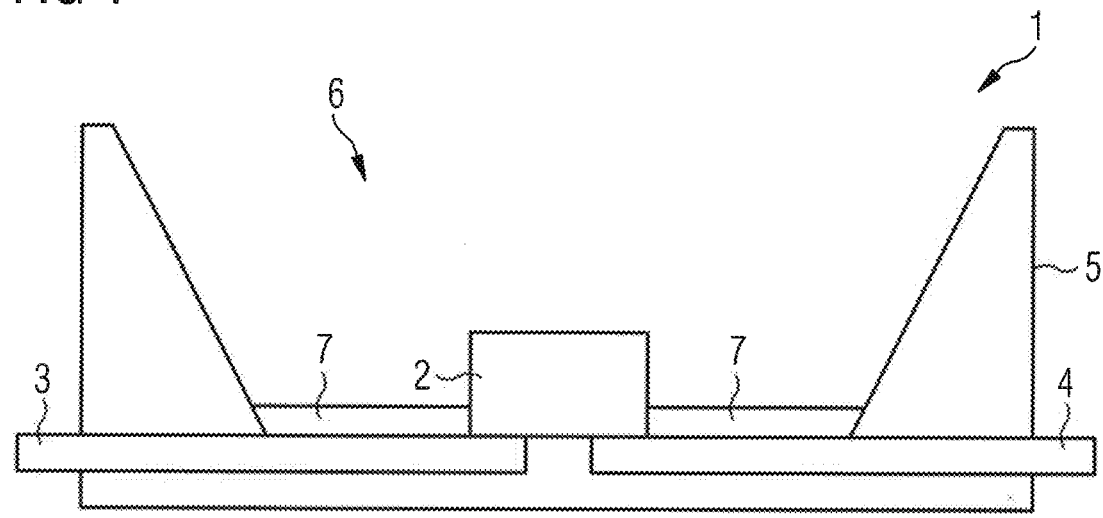
FIGS. 1 to 4 show schematic illustrations of an optoelectronic device according to different embodiments.
Figure 2:
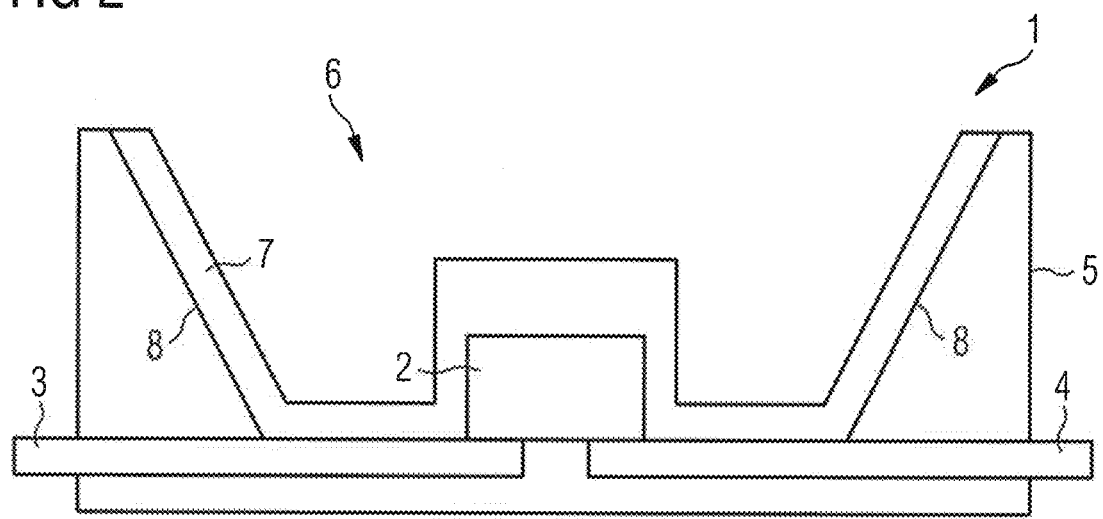

The optoelectronic devices 1 in FIGS. 1 and 2 each comprise an active layer stack 2 which is configured to emit electromagnetic radiation. The active layer stack 2 is contacted with electrical contacts 3, 4. In particular, the electrical contacts 3, 4 have at least a metallic surface, preferably made of silver. For example, the electrical contacts 3, 4 are part of a lead frame. For stabilization and protection, the active layer stack 2 can be arranged in the recess 6 of a housing 5. At least one surface of the housing may be a reflective surface 8 as shown, for example, in FIG. 2. In particular, the reflective surfaces 8 are metallic, preferably made of silver.

A protective layer 7 can be arranged on selectively predetermined surfaces, for example, the surfaces of the electrical contacts 3, 4 (FIG. 1). Alternatively, the protective layer 7 can be arranged on all exposed surfaces of the components protecting the surfaces of the electrical contacts 3, 4 as well as the reflective surface 8 of the housing 5 (FIG. 2).

In addition, the recess 6 of the housing 5 can be filled with an encapsulation 9 (not shown here) for further protection and stabilization. The encapsulation 9 can at least partially, preferably completely, surround the components of the optoelectronic devices 1. The encapsulation 9 is, for example, made of silicone or epoxy resin.

Figure 3:
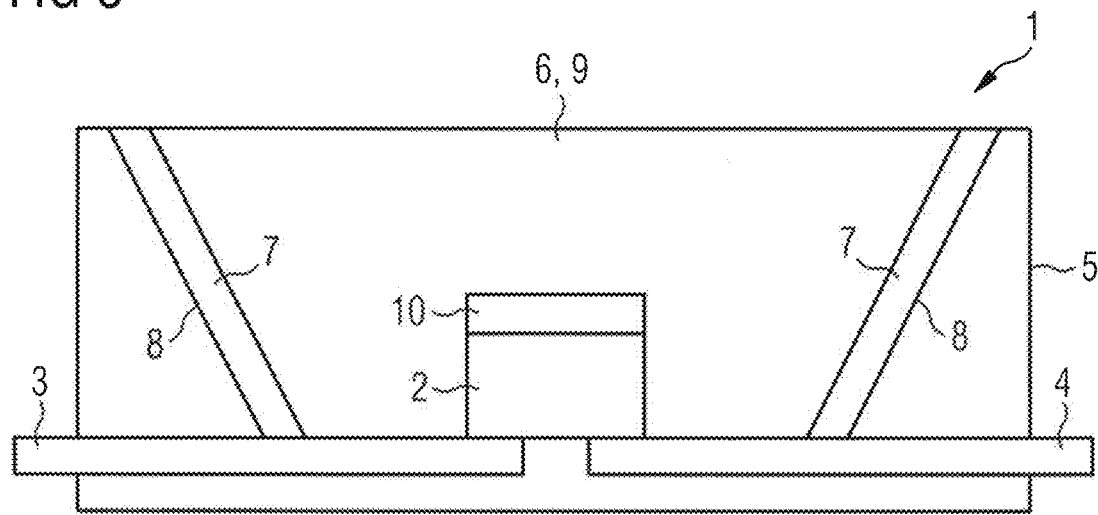
Figure 4:
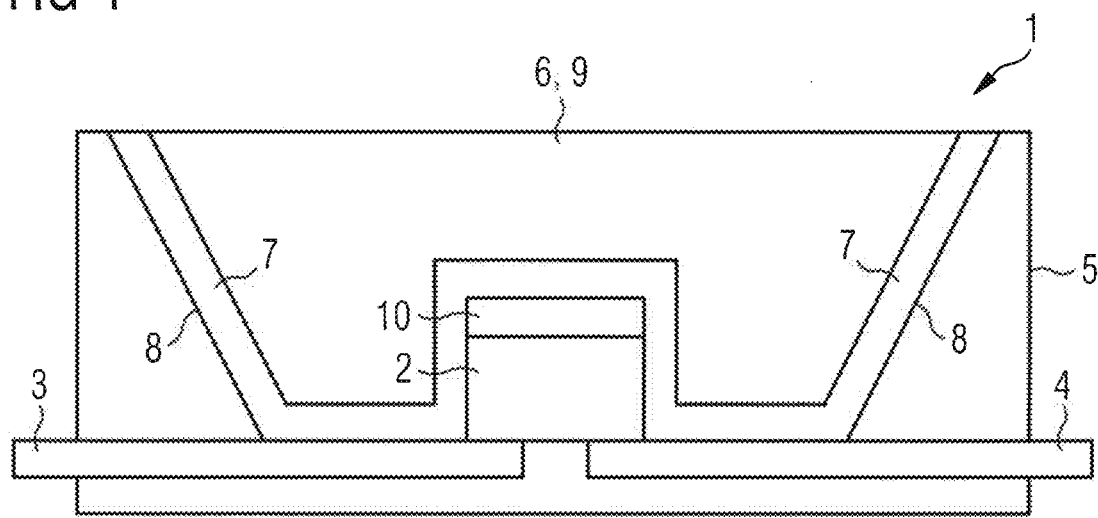

The optoelectronic devices 1 in FIGS. 3 and 4 each further comprise a conversion element 10. The conversion element 10 is arranged above the active layer stack 2 in such a way that the radiation emitted from the active layer stack 2 passes through at least a part of the conversion element 10. The conversion element 10 can be in direct contact to the active layer stack 2 or the conversion element 10 and the active layer stack 2 can be spaced apart (not shown here). That is to say that other layers or spaces can be located between the active layer stack 2 and the conversion element 10.

The conversion element 10 is configured to convert the wavelength of the electromagnetic radiation emitted from the active layer stack 2. In particular, the conversion element 10 absorbs the incident electromagnetic radiation and reemits electromagnetic radiation with a different, preferably longer, wavelength.

The protective layer 7 can again be arranged on selectively predetermined surfaces, for example, the reflective silver surfaces 8 of the housing 5 (FIG. 3). Alternatively, the protective layer 7 can be arranged on all exposed surfaces of the components prior to encapsulating the optoelectronic devices 1 (FIG. 4).

A protective layer 7 with a cross-linked material with a polysiloxane-based network can be produced according to the following exemplary embodiment:

A methoxy methyl siloxane with n=1, m=0, $R^1=R^2$=methyl and a methoxy content in the order of 30-40 wt % is chosen as the liquid precursor material. The liquid siloxane precursor material can be a mixture of different molecular weight species all fulfilling the structural requirement listed in the previous sentence and therefore leading to a viscosity in the range of 1-50 mPa·s, preferably in the range of 2-40 mPa·s. Just prior to application, 0.5-5.0 wt % of titanium n-butoxide is added to the liquid siloxane precursor material. The precursor/hardener mixture is applied, either selectively on the exposed electrical contacts 3, 4 (FIG. 1), on the exposed reflective silver surfaces 8 of the housing 5 (FIG. 3) or on all of the exposed surfaces (FIGS. 2 and 4). The liquid siloxane precursor material is then allowed to react to form the highly cross-linked polysiloxane layer 7. The thickness of the layer can be around 1 µm. Once the curing is complete, the remainder of the optoelectronic device fabrication steps, if any, is carried out.

Figure 5:
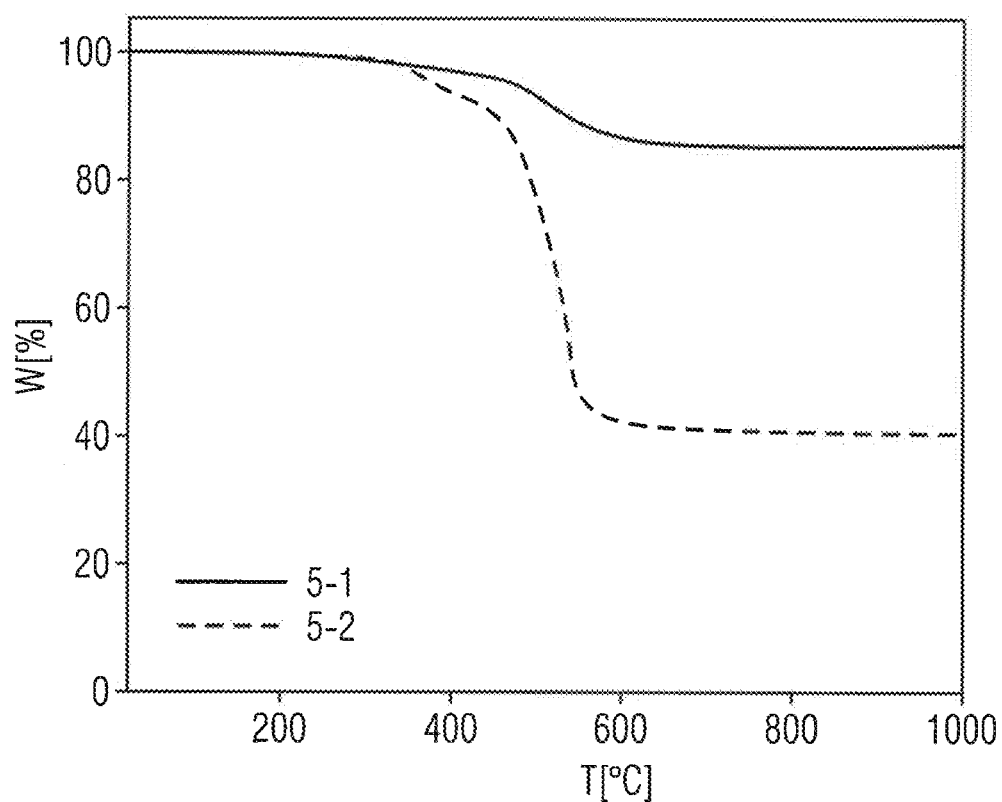
FIG. 5 shows thermogravimetric analysis profiles of a comparative silicone material and a polysiloxane material according to an exemplary embodiment.
Figure 6:
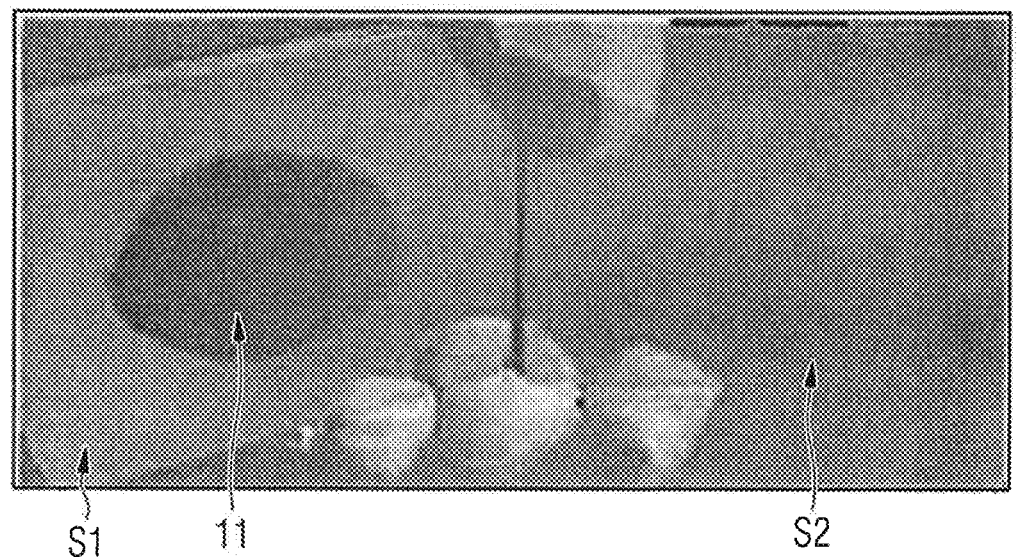
FIG. 6 shows exemplary silver surfaces with and without a protective layer.

FIG. 5 shows a thermogravimetric analysis profile of a comparative methyl-based silicone (5-2), a D-unit based component cured by addition reactions, in comparison to a polysiloxane (5-1) according to one embodiment, i.e., a moisture cured T-unit based component. The y-axis shows the weight W in %, the x-axis shows the temperature T in ° C. The standard silicon reference 5-2 loses almost 60% of its weight indicating a large organic content. In contrast, the polysiloxane material 5-1 loses less than 20% of its weight indicating a significantly lower organic content. The significantly lower organic content leads to an enhanced thermal stability and impermeability of the protective layer 7 in comparison to analogous materials based on standard optical silicones.

FIG. 5 shows two silver mirrors that were exposed to $H_2S$ gas at 100° C. for a week. The mirror S1 was not coated with a protective layer, while the mirror S2 was coated with a thin transparent layer of the cross-linked polysiloxane-based material as a protective layer. The silver of the mirror S1 reacted with the $H_2S$ gas and formed gray/black silver sulfide ii that is detrimental to the reflectivity of the silver mirror. Due to the transparent protective layer, the reflectivity of the mirror S2 remains intact.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. An optoelectronic device comprising:
    components including an active layer stack, a housing and electrical contacts; and
    at least one protective layer on a surface of at least one of the components,
    wherein the at least one protective layer comprises a cross-linked material with a three-dimensional polysiloxane-based network,
    wherein the cross-linked material with the three-dimensional polysiloxane-based network is made from a liquid precursor material comprising the following structure:

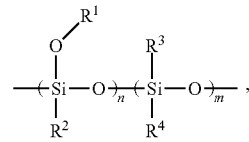

wherein $R^1$ is an alkyl group,
    wherein $R^2$, $R^3$ and $R^4$ are, independently of one another, an alkyl or an aryl group and n+m=1, and
    wherein a viscosity of the liquid precursor material is between 1 mPa·s and 150 mPa·s inclusive.

2. The optoelectronic device according to claim 1, wherein the at least one protective layer is free of a converter material.

3. The optoelectronic device according to claim 1, wherein $0.50 \leq n \leq 1$ and $0 \leq m \leq 0.50$.

4. The optoelectronic device according to claim 1, wherein the liquid precursor material comprises a methoxy methyl siloxane.

5. The optoelectronic device according to claim 1, wherein the at least one protective layer is arranged on a surface of the housing and is in direct mechanical contact with the surface of the housing.

6. The optoelectronic device according to claim 5, wherein the surface of the housing comprises silver.

7. The optoelectronic device according to claim 1, wherein the at least one protective layer comprises traces of titanium, zirconium or tin.

8. The optoelectronic device according to claim 1, wherein the at least one protective layer has a layer thickness of 0.5 µm to 50 µm.

9. The optoelectronic device according to claim 1, wherein the liquid precursor material comprises a methoxy methyl phenyl siloxane.

* * * * *